Figure 1:
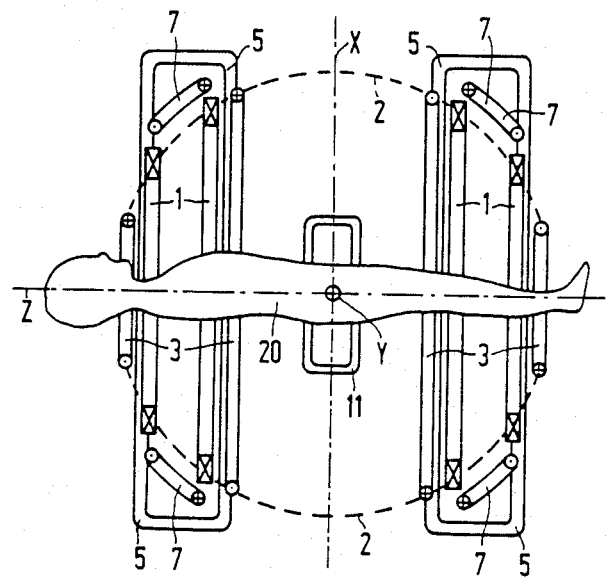

United States Patent [19]

McKinnon

[11] Patent Number: 4,733,184

[45] Date of Patent: Mar. 22, 1988

[54] METHOD FOR THE DETERMINATION OF THE NUCLEAR MAGNETIZATION DISTRIBUTION IN A LAYER OF A REGION UNDER INVESTIGATION, AND NUCLEAR SPINTOMOGRAPH FOR CARRYING OUT THE METHOD

[75] Inventor: Graeme-Colin McKinnon, Ellerau, Fed. Rep. of Germany

[73] Assignee: U.S. Philips Corporation, New York, N.Y.

[21] Appl. No.: 1,294

[22] Filed: Jan. 7, 1987

[30] Foreign Application Priority Data

Feb. 12, 1986 [DE] Fed. Rep. of Germany ....... 3604281

[51] Int. Cl.⁴ .......................................... G01R 33/20
[52] U.S. Cl. .................................... 324/309; 324/307
[58] Field of Search ............... 324/300, 307, 312, 309, 324/313, 314; 128/653

[56] References Cited

U.S. PATENT DOCUMENTS

| | | | |
|---|---|---|---|
| 4,506,222 | 3/1985 | Edelstein | 324/309 |
| 4,516,582 | 5/1985 | Redington | 324/309 |
| 4,602,214 | 7/1986 | Edelstein | 324/309 |
| 4,625,170 | 11/1986 | Yamamoto | 324/309 |

Primary Examiner—Michael J. Tokar
Attorney, Agent, or Firm—Algy Tamoshunas

[57] ABSTRACT

The invention relates to a sequence with a very short echo time. However, during the measurement, there is a constant gradient, the direction of which is varied from sequence to sequence, while its magnitude remains constant. The shortening of the echo time is achieved in that in the first instance on both sides of the layer to be excited, two comparatively thick regions are excited. The nuclear magnetization excited in these regions is dephased, and subsequently a likewise comparatively thick region is excited by a further high-frequency pulse, which encompasses the layer to be excited as well as a part of the regions on both sides of the layer.

10 Claims, 8 Drawing Figures

METHOD FOR THE DETERMINATION OF THE NUCLEAR MAGNETIZATION DISTRIBUTION IN A LAYER OF A REGION UNDER INVESTIGATION, AND NUCLEAR SPINTOMOGRAPH FOR CARRYING OUT THE METHOD

The invention relates to a method for the determination of the nuclear magnetization distribution in a layer of a region under investigation, which is exposed, in the presence of a homogeneous steady magnetic field, to a number of sequences, each sequence comprising at least two high-frequency pulses, a magnetic gradient field effective during at least one high-frequency pulse, with a gradient extending perpendicular to the layer, as well as, after the high-frequency pulses, a measurement interval in which a further magnetic gradient field with a gradient extending in the layer and variable in its direction is applied and, for the reconstruction of the absorption distribution, the nuclear spin resonance signals generated in the region under investigation are recorded. The invention further relates to a nuclear spintomograph for carrying out this method.

It is known that the amplitude of a nuclear spin resonance signal, which is generated in a region under investigation, in the presence of a steady homogeneous magnetic field and after a high-frequency magnetic field which extends perpendicular to this field and which has a larmor frequency has acted on it, decreases exponentially with time. In this procedure, the time constant with which this decrease takes place is given by the so-called spin-spin relaxation time T2—in the event that the steady magnetic field is precisely homogeneous; otherwise, it is even shorter. The relaxation time T2 is dependent, on the one hand, upon the nature of the atomic nuclei, the resonance of which is excited by the high-frequency field, and, on the other hand, upon the nature of their bonding in the body to be investigated. In this connection, relatively short relaxation times arise in various cases. Thus, for example, the spin-spin relaxation time of the sodium isotope 23, when it is situated in cells of the human body, is of the order of magnitude of 2 ms. It is clear that, in such cases, the period of time between the excitation of the nuclei by the high-frequency pulse and the measurement interval in which the nuclear spin resonance signal is received and digitalized for the purpose of the reconstruction of the nuclear magnetization distribution must be as short as possible; this period of time is also referred to as the echo time TE.

In the initially mentioned, so-called back projection method (cf. "Röntgenpraxis" (X-ray Practice) 38, 1985, page 316), in which the gradient of the magnetic gradient field which is effective during the measurement interval is varied in its direction from sequence to sequence, while the magnitude of the gradient remains constant, the echo time is reduced in comparison with the multi-dimensional Fourier transformation methods in which between the high-frequency excitation interval and the measurement interval there is in addition a phase coding interval, because, in this case, the phase coding interval is omitted. However, in this case also, the echo times are still relatively large, if the high-frequency excitation takes place by two high-frequency pulses, as in the case of the so-called spin-echo investigations (cf. "Röntgenpraxis" (X-ray Practice) 38 (1985), page 352).

If, on the other hand, only a single high-frequency pulse is employed for the excitation of a layer, then the echo time—in this case, the period of time between the centre of the high-frequency pulse and the commencement of the measurement interval—is indeed already shorter, but not yet short enough, if a thin layer is to be excited. The thickness of the excited layer is in fact proportional to the bandwidth of the high-frequency pulse. Accordingly, a thin layer requires the application of a narrow-band high-frequency pulse, which increases the echo time. To this it should be added that the polarity of the gradient of the magnetic gradient field effective during the high-frequency pulse must be inverted after the high-frequency pulse, so that upon deactuation of this field—prior to the commencement of the measurement interval—the temporal integral over this gradient field from the centre of the high-frequency pulse to the point of deactuation is zero. This process, which is necessary in order to ensure that the nuclear magnetization prior to commencement of the measurement interval has the same phase relation everywhere within the layer, causes an additional increase in the echo time.

The object of the present invention is to provide a method for the determination of the nuclear magnetization in a layer, in the case of which method the echo time can, on the other hand, be reduced, even in the case of thin layers.

Proceeding from a method of the initially mentioned type, this object is fulfilled according to the invention in that in each sequence the nuclear spin resonance in two regions disposed on both sides of the layer is excited by at least one high-frequency pulse, and in that, after the dephasing of the excited nuclear magnetization, the nuclear magnetization is excited by a further high-frequency pulse in a region encompassing a part of the regions as well as the layer.

In the case of the invention, in the first instance the nuclei are excited by at least one high-frequency pulse in two regions limiting the layer to be excited. As a result of this, the resulting nuclear magnetization vector in these regions tilts—preferably by 90°—out of the direction of the steady homogeneous magnetic field. The nuclear magnetization in this region dephases—possibly by means of an additionally applied magnetic gradient field. When, after this, a region encompassing a part of these regions and the layer is excited by the further high-frequency pulse, then the nuclei excited in the two regions by the further high-frequency pulse make no contribution to the nuclear spin resonance signal occurring after this pulse, because they are dephased, so that the nuclear spin resonance signal contains information only on the layer which was previously not yet excited. In this procedure, the further high-frequency pulse has a substantially greater bandwidth than is necessary for the excitation of the layer. Consequently, its duration is substantially shorter, whereby the echo time can be reduced.

A further refinement of the invention provides that the nuclear magnetization in the regions disposed on both sides of the layer is excited by respective high-frequency pulses in association with a magnetic gradient field with a gradient extending perpendicular to the layer. If, in further refinement of the invention, it is added that the two high-frequency pulses have the same temporal progression and that the polarities of the gradients of the magnetic gradient field are opposite to one another in the case of the two high-frequency pulses, this results in particularly simple conditions, since both high-frequency pulses have the same signal progression.

Another refinement of the invention provides that the nuclear magnetization in the two regions is excited in the presence of a magnetic gradient field with a gradient extending perpendicular to the layer by a single high-frequency pulse, the temporal progression of which is selected in such a manner that in the frequency spectrum of the pulse, the frequency ranges which are allocated to the layer are missing and the adjacent frequency ranges are present. Accordingly, in this connection, only a single high-frequency pulse is required for the excitation of the two regions bounding the layer. However, its temporal progression is more complicated than in the case of the two previously mentioned pulses. Its duration cannot be shorter (in the case of the same gradient of the gradient field effective during this pulse) than that of a pulse which has a sufficiently narrow bandwidth in order to excite only this layer. Since, however, the actual excitation of the layer takes place by the further high-frequency pulse, this has no effect on the duration of the echo time. The essential matter is simply that the time which elapses from the high-frequency pulse or pulses for the excitation of the regions disposed on both sides of the layer to the further high-frequency pulse, which excites the nuclear magnetization in the layer, is small in comparison with the spin lattice relaxation time T1 of the atomic nuclei to be excited in the layer. Otherwise, the atomic nuclei of the same type which are present in the regions on both sides of the layer would supply a no longer negligible contribution to the nuclear spin resonance signal.

This is also the reason why the high-frequency pulse(s) for excitation of the regions disposed on both sides of the layer should be 90° pulses, so that the nuclear magnetization in the excited regions is tilted by 90° out of the direction of the homogeneous steady magnetic field.

A nuclear spintomograph for carrying out the method according to the invention is provided with a magnet for the generation of a homogeneous steady magnetic field, a high-frequency coil arrangement for the generation of a high-frequency magnetic field perpendicular to the steady magnetic fields, a gradient coil arrangement for the generation of magnetic fields, extending in the direction of the steady magnetic field, with gradients extending in differing directions, a high-frequency generator to supply the high-frequency coil arrangement, and with generators for supplying the gradient coils, as well as with a control unit for the control of the high-frequency generator and of the generators, and is characterized in that the control is programmed in such a manner that in the first instance at least one high-frequency pulse and a magnetic gradient field with a gradient perpendicular to the layer is generated, in such a manner that the nuclear magnetization is excited in two regions disposed on both sides of a layer, and in that then a further pulse, of narrow bandwidth, is generated, which excites the nuclear magnetization in a region including a part of the regions and the layer.

Figure 2:
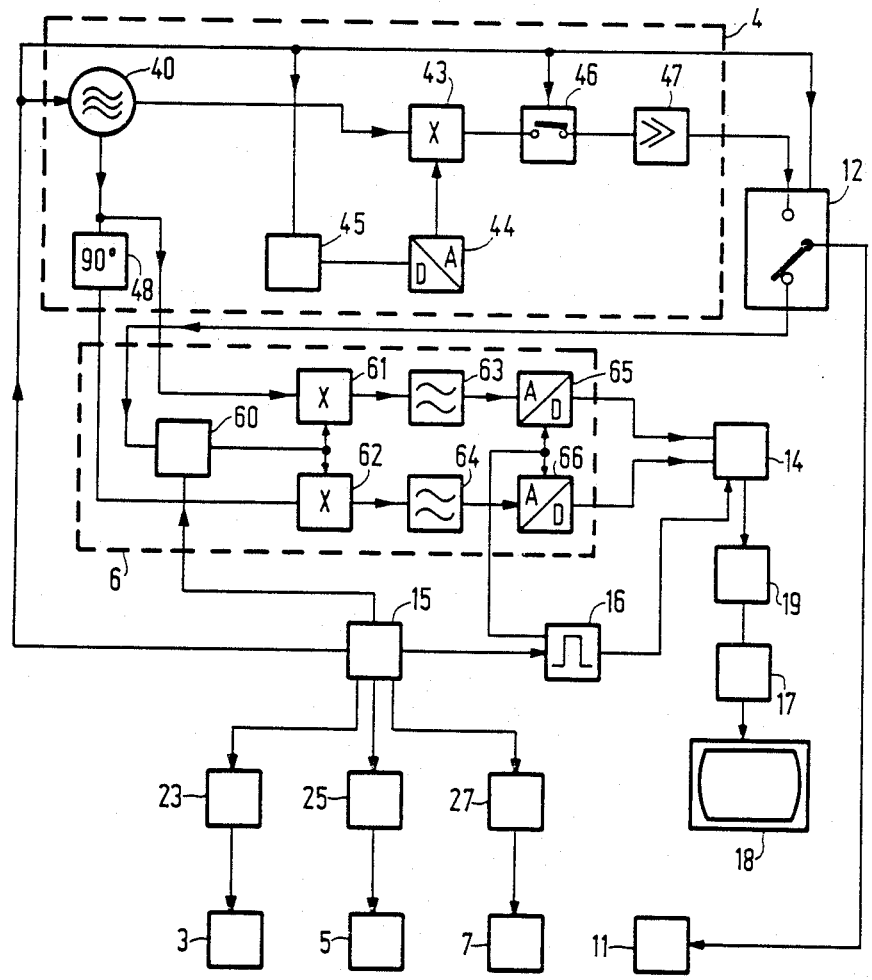
Figure 3:
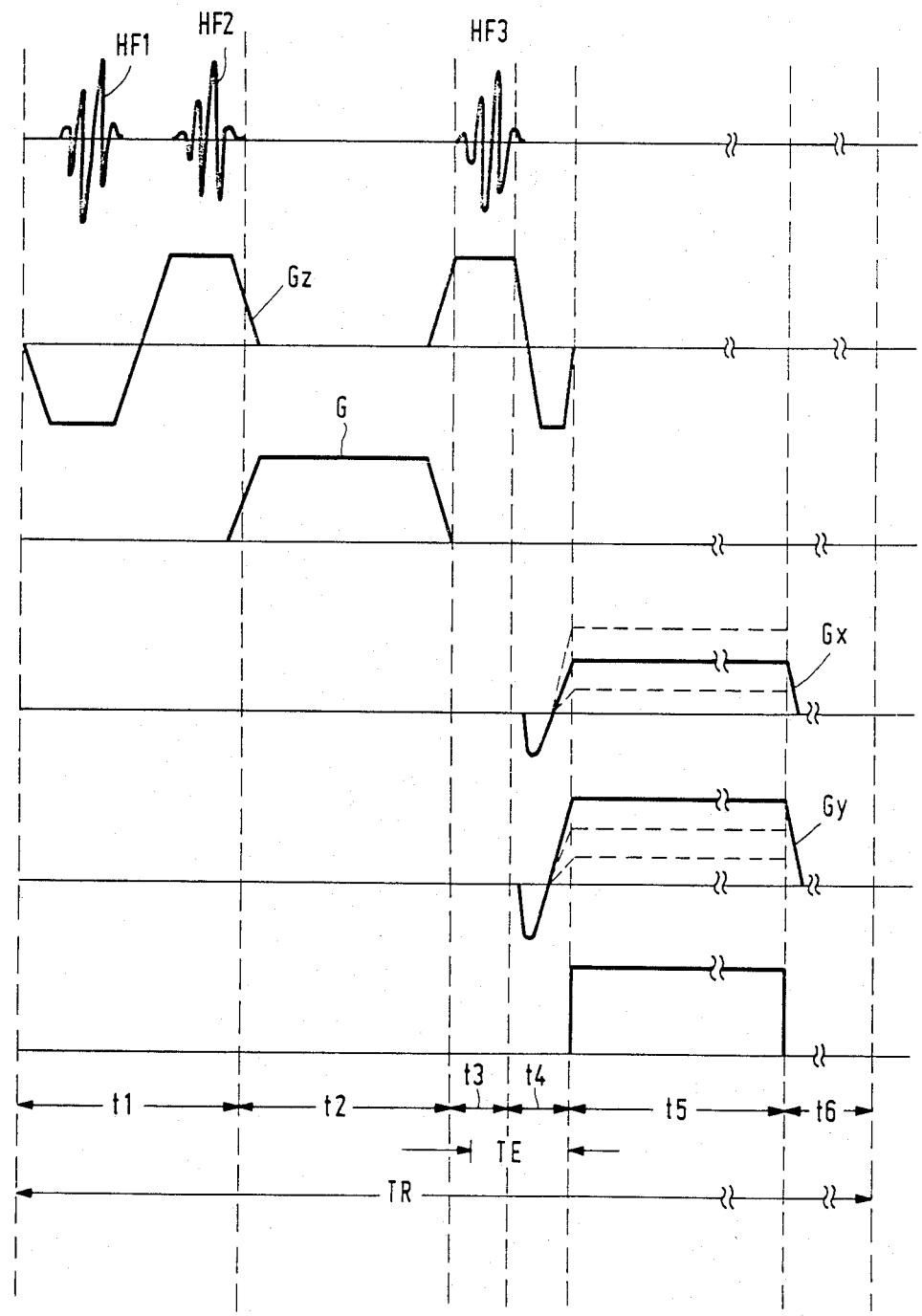

The invention is explained in greater detail below, with reference to the drawing. In the drawing:

FIG. 1 shows a nuclear spin investigation device, in which the invention is applicable FIG. 2 shows a block diagram of such a device, FIG. 3 shows the temporal progression of differing signals in a sequence according to the invention, FIG. 4a to 4e show various diagrams to explain the action of the sequence.

The nuclear spin tomograph shown schematically in FIG. 1 includes an arrangement, consisting of four coils 1, for the generation of a homogeneous steady magnetic field, which can be of the order of magnitude of a few tenths of a tesla to a few tesla. This field extends in the z-direction of a Cartesian coordinate system. The coils 1, which are disposed concentrically in relation to the z axis, can be disposed on a spherical surface 2. The patient 20 to be investigated is located within these coils. Four coils 3 are preferably disposed on the same spherical surface, for the generation of a magnetic field Gz, which extends in the z direction and which varies linearly in this direction. Furthermore, four coils 7 are provided, which generate a magnetic gradient field Gx, which extends likewise in the z direction but the gradient of which extends in the x direction. A magnetic gradient field Gy, extending in the z direction, with a gradient in the y direction, is generated by four coils 5, which can be identical with the coils 7, but which are disposed so as to be spatially offset by 90° in relation to these. Of these four coils 5, only two are shown in FIG. 1.

Since each of the three coil arrangements 3, 5 and 7 for the generation of the magnetic gradient fields Gz, Gy and Gx is disposed symmetrically in relation to the spherical surface 2, the field strength at the centre of the sphere, which centre forms at the same time the coordinate origin of the abovementioned Cartesian x,y,z coordinate system, is determined only by the steady homogeneous magnetic field of the coil arrangement 1. Furthermore, a high-frequency coil 11 is disposed symmetrically in relation to the z=0 plane of the coordinate system, and this is designed in such a manner that on this basis a substantially homogeneous high-frequency magnetic field is generated, extending in the x direction, i.e. perpendicular to the direction of the steady homogeneous magnetic field. A high-frequency modulated current is fed to the high-frequency coil from a high-frequency generator during each high-frequency pulse. Following one or more high-frequency pulses, the high-frequency coil 11 serves for the reception of the echo signals generated by nuclear spin resonance in the region under investigation. In place of this, however, it is also possible to apply a separate high-frequency receiving coil.

FIG. 2 shows a simplified block diagram of this nuclear spin tomography apparatus. The high-frequency coil 11 is connected via a reversing arrangement 12 on the one hand to a high-frequency generator 4 and on the other hand to a high-frequency receiver 6.

The high-frequency generator 4 includes a high-frequency oscillator 40, the frequency of which is digitally controllable and which exhibits oscillations with a frequency equal to the Larmor frequency of those atomic nuclei, the spatial distribution of which in the layer is to be determined, at the field strength generated by the coils 1. The Larmor frequency f is computed in known manner in accordance with the equation f=cB, where B represents the magnetic induction in the steady homogeneous magnetic field and c represents the gyromagnetic ratio, which amounts, for example for hydrogen protons, to 42.56 MHz/T (megahertz/tesla) and for the sodium isotope Na 23 to 11.26 MHz/T. The output of the oscillator 40 is connected to an input of a mixer stage 43. To the mixer stage 43 there is fed a second input signal from a digital-analogue converter 44, the input of which is connected to a digital store 45. A sequence of digital data words representing an envelope curve signal is read out—controlled by a control arrangement 15—from the store 45.

The mixer stage 43 processes the input signals fed to it in such a manner that the carrier oscillation modulated by the envelope curve signal appears at its output. The output signal of the mixer stage 43 is fed, via a switch 46 controlled by the control arrangement 15, to a high-frequency power amplifier 47, the output of which is connected to the reversing arrangement 12. The latter is likewise controlled by the control arrangement 15.

The receiver 6 includes a high-frequency amplifier 60, which is connected to the reversing arrangement 12 and to which the echo signals which are induced in the high-frequency coil 11 and which are generated by nuclear spin resonance are fed, when the reversing arrangement 12 is appropriately controlled. The amplifier 60 possesses a silent switching input, which is controlled by the control arrangement 15 and by means of which the amplifier can be blocked, so that the amplification is for practical purposes zero. The output of the amplifier 60 is connected to the first inputs of two multiplicative mixer stages 61 and 62, which supply in each instance an output signal corresponding to the product of their input signals. A signal having the frequency of the oscillator 40 is fed to the second inputs of the mixer stages 61 and 62; in this connection, a phase shift of 90° exists between the signals at the two inputs. This phase shift is generated by means of a 90° phase rotation element 48, the output of which is connected to the input of the mixer stage 62 and the input of which is connected to the input of the mixer stage 61 and to the output of the oscillator 40.

The output signals of the mixer stage 61 and 62 are fed to analogue-digital converters 65 and 66 respectively, via low-pass filters 63 and 64, which suppress the frequency supplied by the oscillator 40 as well as all frequencies higher than the same, and transmit low-frequency components. The latter converter converts the analogue signals of the circuit 61 ... 64 forming a quadrature demodulator into digital data words, which are fed to a store 14. The analogue-digital converters 65 and 66 as well as the store 14 receive their clock pulses from a clock pulse generator 16, which can be blocked or cleared via a control line by the control arrangement 15, so that only in a measurement interval defined by the control arrangement 15 can the signals which are supplied by the high-frequency coil 11 and which are transposed into the low-frequency range be converted into a sequence of digital data words and stored in the store 14.

The three coil arrangements 3, 5 and 7 are supplied in each instance, by current generators 23, 25 and 27, with a current, the temporal progression of which is controllable by the control unit 15. The data words or scanning values stored in the store 14 are fed to a computer 17, which determines therefrom the spatial distribution of the nuclear magnetization in the investigated layer and outputs the determined distribution at an appropriate reproduction unit, e.g. a monitor 18.

FIG. 3 shows the temporal progression of various signals received or generated with the circuit according to FIG. 2, for a single sequence. Each sequence is composed of six directly successive time intervals t1 ... t6.

Figure 4A:
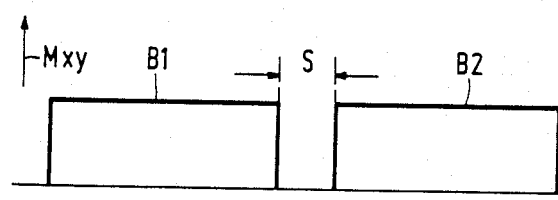

In the first time interval t1, the atomic nuclei of the type to be detected are brought into nuclear spin resonance, in two regions B1 and B2—cf. FIG. 4a—which are situated directly on both sides of the layer S, within which the nuclear magnetization distribution is to be determined. For this purpose, in the time interval t1 the high-frequency generator 4 is connected, for at least part of the time, via the switch 12 to the high-frequency coil 11, so that—cf. the first line of FIG. 3—two 90° pulses HF1 and HF2 are generated. At the same time, there flows through the high-frequency coil arrangement 3 a current, the temporal progression of which is controlled by the control unit 15 in such a manner that the coil arrangement 3 generates a magnetic gradient field Gz, the gradient of which in the case of the second high-frequency pulse HF2 has the opposite polarity to that applicable in the case of the first high-frequency pulse HF1 (cf. the second line of FIG. 3).

The effect of this measurement may be explained with reference to FIG. 4a, which shows the desired—idealized—progression of the nuclear magnetization perpendicular to the homogeneous steady magnetic field, as a function of the position z. In FIG. 4a, S designates the layer, the spatial nuclear magnetization distribution of which is to be determined. This is limited on both sides by respective regions B1 and B2. The thickness of the regions B1 and B2, i.e. their dimensions in the z direction, is substantially greater than the thickness of the layer S or than their dimensions in the z direction. Preferably, the two regions B1 and B2 are equally thick.

The difference between the Larmor frequency at the origin of the coordinate system and at the position z, which is obtained on application of a magnetic gradient field with gradients extending in the z direction, is known to be proportional to the product of the z coordinate and of the gradient. Accordingly, a determined Larmor frequency may be allocated to each plane perpendicular to the z axis, in the case of a constant gradient in the z direction. Accordingly, the frequencies fa and fb are allocated to the centres of the regions B1 and B2, while the frequency fo is allocated to the centre of the layer S, as is also evident from FIG. 4b. The spacing of the frequency fo relative to the frequencies fa and fb amounts to df, if, as is assumed, the regions are equally thick.

Figure 4B:
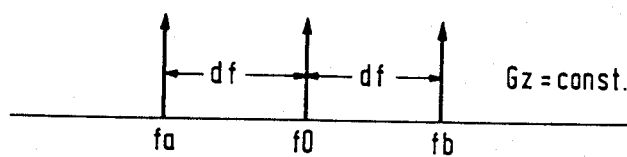

It accordingly follows from FIG. 4b that the nuclear magnetization can be excited in the regions B1 and B2 if—in each instance with the same gradient field Gz—two high-frequency pulses are generated, the bandwidth of which is proportional to the thickness of the regions B1 and B2 respectively and the central frequency of which is at fa and fb respectively. This would presuppose that, in the case of the circuit according to FIG. 2, the oscillator frequency is reversed between the first and the second high-frequency pulse from fa to fb, while the envelope curve signal derived from the store 45 can be the same in both cases.

The generation of the two high-frequency pulses for the excitation of the layers B1 and B2 can be even further simplified, if the centre of the layer S is in the plane z=0, where, as is assumed, the induction of the magnetic gradient field Gz is equal to zero. Specifically, if the polarity of the gradient field is reversed between the two high-frequency pulses, then the same z-dependence of the magnetic induction is obtained during the first pulse in one region as during the second pulse in the other region. Consequently, the two pulses can have the same spectrum or the same temporal progression, and there is no need for the oscillator frequency to be reversed between the two pulses; it can retain its value (fa) during the two pulses.

Figure 4C:
Figure 4D:
Figure 4E:
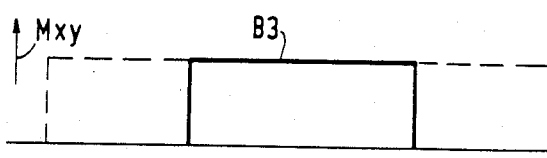

It is, however, also possible to excite both regions simultaneously and with only a single pulse, the spectrum of which corresponds to the difference of the two spectra represented in FIGS. 4c and 4d. The spectrum S1(f) is so broad that it can excite the entire range between the left-hand boundary of the region B1 and the right-hand boundary of the region B2. The spectrum S2(f) corresponds to that of a pulse which, of itself alone, could excite only the layer S. If the two spectra are subtracted, then the result is a broad spectrum with a lacuna at the centre. The temporal progression of the envelope curve signal of a pulse, the frequency spectrum of which corresponds to the difference S1(f)–S2(f), is obtained if both spectral functions S1(f) and S2(f) are separately subjected to a Fourier transformation from the frequency range into the time range and the resultant signals are subtracted from one another. The envelope curve signal obtained in this manner is stored in the store 45 and mixed, in the mixer stage 43, with the output signal of the oscillator, the frequency of which is in this case fo.

The nuclear magnetization excited either by one or by two high-frequency pulses within the time t1 must be dephased before the actual excitation of the layer takes place. Only in this case is it possible to obtain, after excitation by a (short) high-frequency pulse of large bandwidth, nuclear resonance signals only from the layer. The dephasing takes place in part already in that after the second high-frequency pulse the polarity of the gradient field Gz is not inverted. In the event that this dephasing is, however, not sufficient, in the time interval t2 following the time interval t1 a magnetic gradient field G is actuated, which retains its polarity in this interval (cf. Line 3 in FIG. 3). In principle, the gradient of this field can extend in the x, y or z direction.

In the time interval t3 following the interval t2, a further high-frequency pulse HF3 is generated (line 1) and again a magnetic gradient field with a gradient in the z direction which is constant during the high-frequency pulse is actuated (line 2). The high-frequency pulse HF3 has the same envelope curve as the high-frequency pulses HF1 and HF2. It accordingly also has the same bandwidth and the same duration. However, the carrier frequency of this pulse must correspond to fo (cf. FIG. 4b), i.e. the oscillator frequency must be switched over from fa to fo after the first two high-frequency pulses HF1 and HF2. Since the high-frequency pulse HF3 has the same bandwidth as the high-frequency pulses HF1 and HF2, the nuclear magnetization would be excited by it, of itself, in a region B3, which is substantially broader than the layer S, i.e. therefore also in a part of the regions B1 and B2. Since in these parts the nuclear magnetization is, however, already dephased, no contribution to the nuclear spin resonance signal is made from these parts. This signal is solely dependent upon the nuclear magnetization distribution within the layer S.

The high-frequency pulse HF3 can have an even greater bandwidth than the high-frequency pulses HF1 and HF2, so long as no nuclear magnetization to the left of the region B1 and to the right of the region B2 is excited thereby; the left-hand boundary of the region B3 then coincides with the left-hand boundary of the region B1, and the right-hand boundary with the right-hand boundary of the region B2, as indicated in broken lines. The high-frequency pulse then has an even shorter duration, but in this case there must additionally be stored in the store 45 a further envelope curve signal, which is multiplied by the frequency fo in the time interval t3.

In the time interval t4 following the interval t3, the polarity of the gradient field Gz is reversed, and the gradient field is deactuated after a determined time. In this connection, the temporal progression of the gradient field is selected in such a manner that the temporal integral over this field from the centre of the high-frequency pulse HF3 to the point of deactuation of this gradient field is precisely zero. In this case, the nuclear magnetization in the excited layer S is independent of z.

Furthermore, in the time interval t4 the gradient fields Gx and Gy are actuated (cf. lines 4 and 5 of FIG. 3), in which connection they reverse their polarity during the interval, until at the end of t4 the gradient has reached a value which it maintains during the following measurement interval t5. In this procedure, the temporal progression of the gradient fields Gx and Gy in the interval t4 is dimensioned in such a manner that the temporal integral over each of the two gradient fields has reached precisely the value zero at the end of the time interval t4 or at the commencement of the time interval t5.

In the following time interval t5, the nuclear spin resonance signal is received (the switch 12 is then situated in the position evident from FIG. 2), and the clock generator 16 is cleared by the control unit 15, as is indicated in FIG. 3 in the sixth line. In consequence of this, during this time interval the received nuclear spin resonance signals are scanned and the scanning values are stored as digital data words in the store 14. The gradient field Gx and Gy are not varied during this measurement. However, as indicated in broken lines, they are varied from sequence to sequence, specifically in such a manner that their magnitude remains constant, while their direction varies. At the end of the measurement interval t5, the clock generator 16 is blocked, i.e. no further scanning values are recorded and stored.

At the commencement of the following time interval t6, the magnetic gradient fields Gx and Gy are also deactuated. In this time interval—which, as a rule, is the longest time interval of the sequence—the nuclear spins are again to be oriented in the z direction, whereafter a new sequence can be applied.

As is shown in FIG. 3, the echo time TE corresponds to the sum of the time interval t4 and one half of the high-frequency pulse HF3. Since the interval t4 is essentially determined by the dephasing in the z direction, and this is in turn dependent upon the time of action of this gradient during the high-frequency pulse, both components and thus the echo signal are the shorter, the shorter is the high-frequency pulse HF3, i.e. the greater is the bandwidth of the latter. Since the duration or bandwidth of the high-frequency pulse HF3 is for practical purposes not dependent upon the thickness of the layer to be excited, it is possible, even in the case of the excitation of relatively thin layers, to achieve very short echo times, the lower limit of which is in these circumstances dependent only upon the speed at which the gradient fields can be reversed.

Although the invention has been explained in the above text in conjunction with the excitation of a layer perpendicular to the z axis, it is likewise possible to apply the method according to the invention in the case of the excitation of a layer perpendicular to the x or to the y axis. In this case, it is simply necessary for the magnetic gradient field to have, in the x or in the y direction, the progression represented in line two of FIG. 3, while the magnetic gradient field Gz must have the progression represented in line four or five.

I claim:

1. A method for determining nuclear magnetization distribution in a layer of a region under investigation, which region is exposed, in the presence of a homogeneous steady magnetic field, to a number of sequences, each sequence comprising at least two high-frequency pulses, a magnetic gradient field effective during at least one high-frequency pulse and having a gradient extending perpendicularly to the layer, each sequence further including a measurement interval which occurs after the pulses and during which a further magnetic gradient field with a gradient which extends in the layer and which is variable in its direction is applied and, for the reconstruction of the absorption distribution, the nuclear spin resonance signals generated in the region under investigation are recorded, characterized in that in each sequence the nuclear spin resonance in two regions each disposed on a respective one of two sides of the layer is excited by at least one high-frequency pulse, and in that, after dephasing of the excited nuclear magnetization, the nuclear magnetization is excited by a further high-frequency pulse in a region encompassing a part of said two regions as well as the layer.

2. A method according to claim 1, characterized in that during each sequence an additional magnetic gradient field is applied for the purpose of dephasing, said additional field being applied prior to the further high-frequency pulse and after the high-frequency pulse preceding said further high-frequency pulse.

3. A method according to claim 1 or 2, characterized in that the nuclear magnetization in said two regions disposed on respective sides of the layer is excited by respective high-frequency pulses in conjunction with a magnetic gradient field with a gradient extending perpendicularly to the layer.

4. A method according to claim 3, characterized in that the two high-frequency pulses have the same temporal progression, and in that the polarities of the gradients of the magnetic gradient field are opposite to one another in the case of the two high-frequency pulses.

5. A method according to claim 1, characterized in that the nuclear magnetization in said two regions is excited, in the presence of a magnetic gradient field with a gradient extending perpendicularly to the layer, by a single high-frequency pulse, the temporal progression of which is selected in such a manner that in the frequency spectrum of the pulse, the frequency ranges which are allocated to the layer are missing and the adjacent frequency ranges are present.

6. A method according to claim 1, 2 or 5, characterized in that the temporal progression of the magnetic gradient field, effective during and after the further pulse, with a gradient perpendicular to the layer, is selected in such a manner that the temporal integral over the gradient from the centre of the high-frequency pulse to the point of deactuation of the gradient field is zero.

7. A method according to claim 1, 2 or 5, characterized in that the further magnetic gradient field is actuated after the further high-frequency pulse with a gradient opposite to the gradient during the measurement interval, and in that it has a temporal progression such that the temporal integral over this field has the value zero at the commencement of the measurement interval.

8. A method according to claim 1, 2 or 5, characterized in that one or two 90° pulses are employed for excitation of the nuclear magnetization in said two regions disposed on respective sides of the layer.

9. A method according to claims 1, 2 or 5, characterized in that the further high-frequency pulse is a 90° pulse.

10. Nuclear spin tomograph for carrying out the method according to claim 1, having a magnet for generating a homogeneous steady magnetic field, a high-frequency coil arrangement for generating a high-frequency magnetic field perpendicular to the steady magnetic field, a gradient coil arrangement for generating magnetic fields extending in the direction of the steady magnetic field, with gradients extending in differing directions, a high-frequency generator to supply the high-frequency coil arrangement, further generators for supplying the gradient coils, and a control unit for controlling the high-frequency generator and the further generators, characterized in that the control unit is programmed in such a manner that in the first instance at least one high-frequency pulse and a magnetic gradient field with a gradient which is perpendicular to the layer is generated in such a manner that the nuclear magnetization is excited in two regions each disposed on a respective one of two sides of a layer of a region under investigation, and then a further pulse, of narrow bandwidth, is generated, which excites the nuclear magnetization in a region including a part of said two regions and the layer.

* * * * *